United States Patent [19]
Matsugatani et al.

[11] Patent Number: 5,449,928
[45] Date of Patent: Sep. 12, 1995

[54] COMPOUND SEMICONDUCTOR SUBSTRATE HAVING A HETERO-JUNCTION AND A FIELD-EFFECT TRANSISTOR USING THE SAME

[75] Inventors: Kazuoki Matsugatani, Kariya; Takashi Taguchi, Anjo; Yoshiki Ueno; Tadashi Hattori, both of Okazaki, all of Japan

[73] Assignee: Nippondenso Co., Ltd., Kariya, Japan

[21] Appl. No.: 120,379

[22] Filed: Sep. 14, 1993

[30] Foreign Application Priority Data

Oct. 27, 1992 [JP] Japan ................................. 4-288765

[51] Int. Cl.⁶ ..................... H01L 29/205; H01L 29.64
[52] U.S. Cl. .................... 257/194; 257/190; 257/201; 257/615
[58] Field of Search ................ 257/194, 190, 201, 615

[56] References Cited

FOREIGN PATENT DOCUMENTS

| | | | |
|---|---|---|---|
| 0199435 | 10/1986 | European Pat. Off. | 257/194 |
| 0228624 | 7/1987 | European Pat. Off. | 257/194 |
| 0495452 | 7/1992 | European Pat. Off. | 257/194 |
| 1-41273 | 2/1989 | Japan | 257/194 |
| 1-162367 | 6/1989 | Japan | 257/194 |
| 3049242 | 3/1991 | Japan . | |
| 3-286540 | 12/1991 | Japan | 257/194 |
| 4162539 | 6/1992 | Japan . | |
| 4180240 | 6/1992 | Japan . | |
| 4294547 | 10/1992 | Japan . | |

OTHER PUBLICATIONS

Lai et al, "Characteristics of 0.8-and 0.2-mm Gate length In$_x$Ga$_{1-x}$As/In 0.52 Al$_{0.48}$As/InP ($0.53 \leq \infty \leq 0.70$ Modulation-Doped Field-Effect Transistors at Cryogenic Temperatures", IEEE Translations on Electron Devices, vol. 39, No. 10, Oct. 1992.

Ngnyer et al, "GJOÅ Self-Aligned-Gate Psenchmorphic Al$_{0.48}$In$_{0.52}$As/Ga$_{0.20}$In$_{0.80}$As High Electronic Mobility Transistors", IEEE Electron Device Letters, vol. 13, No. 3, Mar. 1992.

Ng et al, "Design and Experimental Characteristics of Strained In$_{0.52}$Al$_{0.48}$As/In$_x$Gn$_{1-x}$As ($\infty > 0.53$) HEMT's", IEEE Transactions on Electron Devices, vol. 36, No. 10 Oct. 1989.

Chen et al, 37 Depletion Mode Modulation Doped Al$_{0.48}$In$_{0.52}$As-Ga$_{0.47}$In$_{0.53}$a As Heterojunction Field Effect Transistors, IEEE Electron Device Letters, vol. EDL-3, No. 6, Jun. 1982.

Extended Abstract (The 53rd Autumn Meeting) Japan Society of Applied Physics, Matsugatani et al Abstract 17a-71-8 "Effect of an inserted In$_x$GA$_{1-x}$As layer in In$_{0.52}$Al$_{0.48}$As/In$_{0.8}$Ga$_{0.2}$As Hetero Interface" Sep. 16, 1992.

Kohji Matsumura et al, ED90-115, from Japanese Association of Electronic Information Communication, "A Newly Designed HEMT Wafer With One In As Monolayer In The Channel", pp. 69–74.

Tatsushi Akazaki et al, "Improved INAlAS/InGaAs HEMT Charactristics By Inserting An InAS Layer Into The INGaAs Channel", IEEE Electron Device Letters, vol. 13, No. 6, Jun. 1992, pp. 325–327.

(List continued on next page.)

*Primary Examiner*—Ngân V. Ngô
*Attorney, Agent, or Firm*—Cushman, Darby & Cushman

[57] ABSTRACT

A pseudomorphic HEMT of a structure which prevents the distribution of 2DEG in the channel layer from being concentrated near the hetero-interface relative to a doping layer and which, at the same time, enables the thickness of the channel layer to which distortion is imparted to be decreased. In an n-InAlAs/InGaAs pseudomorphic structure grown on an InP substrate 1, an InGaAs spacer layer 4 having an In composition ratio smaller than that of an InGaAs channel layer 3 is inserted in an InAlAs/InGaAs hetero-interface. The InGaAs channel layer 3 has an In composition ratio of 0.80 to exhibit a high mobility. Another InAlAs buffer layer 2, spacer layer 5 and doping layer 6 have an In composition ratio of 0.52 which is in lattice-match with the substrate, and InGaAs spacer layer 4 and cap layer 7 have an In composition ratio of 0.53 which is in lattice-match with the substrate. This constitution makes it possible to control the two-dimensional electron gas and to further increase the mobility.

7 Claims, 5 Drawing Sheets

OTHER PUBLICATIONS

T. Schweizer et al, "Highly Anisotropic Electron Mobilities of GaAs/In 0.2 Ga 0.8 As/Al 0.3 Ga 0.7 As Inverted High Electron Mobility Transistor Structures", Appl. Phys. Letts 59 (21) Nov. 18, 1991 (pp. 2736–2738).

Jean C. Harmand et al, "Lattice-Mismatched Growth And Transport Properties of InAlAs/InGaAs Heterostructures on GaAs Substrates", Japanese Journal of Applied Physics, vol. 28, No. 7, Jul. 1989, pp. 1101–1103.

S. Sasa et al, "Electronic Properties Of Two-Dimensional Electron Gas In Psudomorphic et al", Journal of Crystal Growth 95 (1989) pp. 189–192.

S. R. Bahl et al, "Orientation Depencence of Mismatched, etc.", Journal of Crystal Growth III 1991, pp. 479–483.

COMPOUND SEMICONDUCTOR SUBSTRATE HAVING A HETERO-JUNCTION AND A FIELD-EFFECT TRANSISTOR USING THE SAME

BACKGROUND OF THE INVENTION

1. Field of the Invention

The present invention relates to a compound semiconductor substrate having a hetero-junction which is best suited for a high electron mobility field-effect transistor (HEMT) that uses two-dimensionally quantized electrons.

2. Description of the Related Art

To improve the performance of a transistor, a mechanism is necessary for switching as many electrons as quickly as possible. In general, when donor impurities are added in large amounts to a semiconductor layer in order to increase the concentration of electrons, the impurities are scattered so greatly that the mobility of electrons decreases inside the semiconductor. This problem can be solved by a known high electron mobility field-effect transistor (HEMT) which uses a material of a high mobility such as GaAs or the like and an active layer of a two-dimensional electron gas (2DEG).

The HEMT has a feature that the layer (channel layer) in which the electrons run and the layer (doping layer) for supplying electrons are composed of different materials, and that the electrons are confined in the channel layer as a two-dimensional electron gas due to the quantum effect, are isolated from the donor impurities in the doping layer, and are scattered slightly. In order to further decrease the scattering, there is often inserted between the doping layer and the channel layer a spacer layer composed of the same material and having the same composition as the doping layer but having no impurities.

Performance of the HEMT can be effectively improved by enhancing the mobility of the channel layer. Recently, a study has been carried out on forming the channel layer by using InGaAs having a mobility greater than that of GaAs. Also, AlGaAs or InAlAs have been known materials for the doping layer that can be used in combination with the InGaAs channel layer.

Here, InGaAs exhibits such a property that the mobility enhances with an increase in the In content (In composition ratio). Increasing the In composition ratio, therefore, makes it possible to obtain a transistor having high performance resulting, however, in an increase in the lattice constant which causes lattice mismatching with respect to the doping layer and the substrate material. Therefore, a pseudomorphic HEMT obtained by growing crystals under a pseudomorphic state is now attracting attention. This utilizes the fact that crystals of good quality can be grown without disorder in the lattice, such as dislocation, even when the materials having different lattice constants are grown involving lattice mismatching though the crystal lattice is distorted and deformed, provided the thicknesses of the films are smaller than a predetermined value called critical film thickness. That is, by increasing the In composition ratio of the channel layer and by selecting the In composition ratio of the doping layer to be smaller than that of the channel layer, a difference in the band gap can be increased between the InGaAs channel layer and the doping layer, whereby the quantum effect efficiently works to confine more electrons making it possible to accomplish both an increase in electron concentration and an increase in mobility.

Here, the confinement of electrons by the quantum effect is determined by the shape of the quantum well that is established by the potential of the conduction band. In order to theoretically analyze the quantum effect, the distribution of two-dimensional electron gas (2DEG) accumulated in the channel layer is calculated by a numerical calculation method which solves the Schraedinger equation and Poisson's equation in a self-consistent analysis. This calculation method is the one that is used for finding the electron distribution in the HEMT.

FIG. 6 shows calculated results of a potential profile and a distribution of 2DEG of the pseudomorphic HEMT of a conventional structure which comprises, formed on a semi-insulating InP substrate 1 in the order mentioned by the crystal growth, an InAlAs buffer layer 2 having an In composition ratio of 52% and whose lattice matches the substrate 1, an InGaAs channel layer 3 having an In composition ratio of 80% and is pseudomorphic to the buffer layer 2, an InAlAs spacer layer 5 for feeding carriers and having an In composition ratio of 52%, an n-type InAlAs doping layer 6 having an In composition ratio of 52% doped with donor impurities, and an n-type InGaAs cap layer 7 having an In composition ratio of 53% which prevents the doping layer from being oxidized.

With the structure which is capable of confining many electrons such as pseudomorphic HEMT as will be obvious from FIG. 6, the potential of the channel layer (InGaAs) 3 is sharply curved and is greatly recessed near the hetero-interface. Therefore, the distribution of electron density exhibits a sharp peak near the hetero-interface and the electrons exist in a large proportion near the hetero-interface.

On the other hand, donor impurities exist in the doping layer (InAlAs) 6 and remain therein being positively charged after the electrons are emitted, and a Coulomb force is applied to the electrons in the channel layer 3. Therefore, the electrons exhibiting a peak deflected toward the hetero-interface are subject to be greatly scattered as they approach the donor impurities; i.e., Coulomb scattering increases relative to the doping layer and the characteristics are adversely affected.

In the pseudomorphic HEMT, furthermore, the channel layer has a lattice constant which is different from those of other layers and receives distortion. As mentioned above, therefore, the channel layer must have a thickness which is smaller than a critical film thickness. Even when the channel layer has a thickness which is smaller than a critical thickness, however, there still remains a problem in that the stability is lost due to aging or due to a sudden change in the temperature, and resistance anisotropy is observed in which the resistivity changes depending upon the crystal azimuth. Moreover, distortion imparted to the film increases as the thickness of the layer to which the distortion is imparted increases, and the above-mentioned problem becomes more conspicuous.

The problem in that the electrons are concentrated near the hetero-interface can be solved by technology according to which a very thin InAs layer is inserted in the channel layer, and the distribution of 2DEG is located at a position remote from the hetero-interface by utilizing the fact that InAs has a small band gap with respect to InGaAs as described in, for example, a Report ED90-115 of the Japanese Association of Electronic Information Communication. However, there still remains a problem in that greater distortion is imparted to the channel layer since InAs has a lattice constant which is larger than that of InGaAs.

SUMMARY OF THE INVENTION

The present invention was accomplished in view of the above-mentioned problems and its object is to provide a HEMT of high performance and high reliability which is improved from the pseudomorphic HEMT of a conventional structure, by preventing the distribution of 2DEG in the channel layer from being concentrated near the hetero-interface and, at the same time, by decreasing the thickness of the channel layer to which distortion is imparted.

The present inventors therefore have devised a structure in which an InGaAs layer (hereinafter referred to as InGaAs spacer layer) is inserted in an interface between the doping layer (or the spacer layer when there exists the spacer layer) and the channel layer to which distortion is imparted, the InGaAs spacer layer having an In composition ratio smaller than that of the channel layer. That is, the InGaAs layer exhibits an increased band gap when its In composition ratio is decreased and the InGaAs spacer layer exhibits a band gap greater than that of the channel layer. Therefore, the potential does not sharply decrease near the hetero-interface as was a problem in the conventional structure, and the electrons are prevented from being concentrated near the interface. Moreover, the InGaAs layer having a decreased In composition ratio exhibits an improved lattice constant matching with other layers, and the InGaAs spacer layer that partly plays the role of the channel layer makes it possible to decrease the thickness of the channel layer (portion having an increased In composition ratio to obtain high mobility) to which distortion is imparted.

That is, according to the present invention in which the InGaAs spacer layer is inserted in the hetero-interface, there is provided a HEMT which simultaneously accomplishes two effects, i.e., prevention of concentration of electrons near the hetero-interface and reduction of distortion imparted to the channel layer.

Concretely speaking, the invention provides a compound semiconductor substrate having a hetero-junction of an InGaAs layer (channel layer) 3 and an InAlAs layer (doping layer) 6 as shown in FIG. 2, wherein the InGaAs layer 3 has an In composition ratio which is greater than an In composition ratio of the InAlAs layer 6, and in a hetero-junction interface where the InGaAs layer 3 and the InAlAs layer 6 are joined together, is inserted an InGaAs layer 4 having an In composition ratio which is nearly equal to the In composition ratio of the InAlAs layer 6 or an InGaAs layer 4 having an In composition ratio which is smaller than the In composition ratio of the InGaAs layer 3.

The invention further provides a field-effect transistor using the above substrate in which a two-dimensional electron gas formed on the side of an InGaAs layer 3 of an InAlAs/InGaAs hetero-junction, is used as an active layer, carriers are fed to the two-dimensional electron gas from the source/drain electrode via an InAlAs doping layer 6, and the running of the electron in the two-dimensional electron gas is controlled by an electric field that is applied to the gate electrode; wherein, the InGaAs channel layer 3 in which the two-dimensional electron gas is formed has an In composition ratio which is greater than the In composition ratio of the InAlAs doping layer 6; and in a hetero-interface where the InGaAs channel layer 3 and the InAlAs doping layer 6 are joined together or in a hetero-interface where the InGaAs channel layer 3 and an InAlAs spacer layer 5 are joined together, is inserted an InGaAs layer 4 having an In composition ratio nearly equal to the In composition ratio of the InAlAs doping layer or an InGaAs layer 4 having an In composition ratio smaller than the In composition ratio of the InGaAs channel layer 3.

With reference to FIG. 5, furthermore, the invention provides a compound semiconductor substrate having a hetero-junction of an InGaAs layer 3 and an AlGaAs layer 6, wherein in a hetero-junction interface where the InGaAs layer 3 and the AlGaAs layer 6 are joined together, is inserted an InGaAs layer 4 having an In composition ratio smaller than the In composition ratio of the InGaAs layer 3.

The invention further provides a field-effect transistor using the above substrate, in which a two-dimensional electron gas formed on the side of an InGaAs layer 3 of an AlGaAs/InGaAs hetero-junction is used as an active layer, carriers are fed to the two-dimensional electron gas from the source/drain electrode via an AlGaAs doping layer 6, and the running of the electron in the two-dimensional electron gas is controlled by an electric field that is applied to the gate electrode; wherein, in a hetero-interface where the InGaAs channel layer 3 and the AlGaAs doping layer 6 are joined together 10 or in a hetero-interface where the InGaAs channel layer 3 and an AlGaAs spacer layer 5 are joined together, is inserted an InGaAs layer 4 having an In composition ratio smaller than the In composition ratio of the InGaAs channel layer 3.

According to the present invention, the conventional pseudomorphic HEMT is improved to exhibit higher performance and higher reliability.

DETAILED DESCRIPTION OF THE PREFERRED EMBODIMENTS

Embodiments of the present invention will now be described in detail in conjunction with the drawings.

Figure 1:
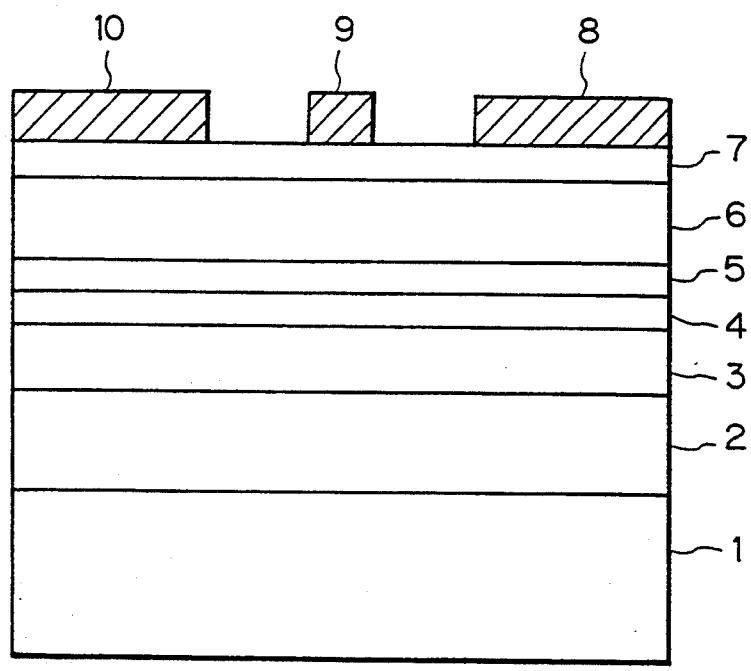
FIG. 1 is a diagram illustrating in cross section the structure of a HEMT in which an InGaAs layer is used as the channel layer according to the present invention.

FIG. 1 is a diagram which illustrates in cross section the HEMT in which an InGaAs layer 3 is used as the channel layer according to the present invention, and wherein on a semi-insulating substrate 1 are formed a buffer layer 2, an InGaAs channel layer 3, an InGaAs spacer layer 4, a spacer layer 5, a doping layer 6 and a cap layer 7. Here, the layers 5 and 6 are made of the same material. The above layers can be successively formed by the MBE method or the MOCVD method. In order to use this structure as a field-effect transistor, there are formed on the uppermost surface a drain electrode 8 which is an ohmic electrode, a source electrode 10, and a gate electrode 9 which is a Schottky electrode. These electrode materials are known ones.

Described below is a first embodiment of the present invention of the above-mentioned InAlAs/InGaAs hetero structure using InAlAs as the doping layer 6.

Figure 2:
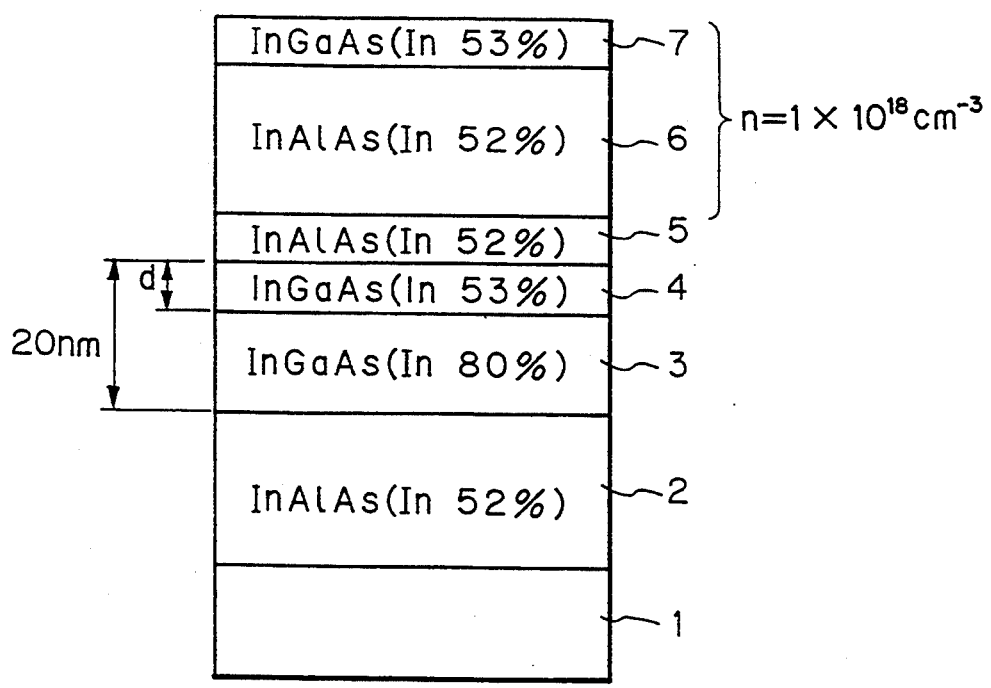
FIG. 2 is a diagram which schematically illustrates the structure of a substrate according to a first embodiment of the present invention.

FIG. 2 illustrates the structure of a substrate according to a first embodiment of the present invention by using InGaAs as the channel layer and InAlAs as the doping layer. As shown in FIG. 2, on a semi-insulating InP substrate 1 are successively grown the crystals of an InAlAs buffer layer 2 maintaining a thickness of, for example, 100 nm, an InGaAs channel layer 3 maintaining a thickness of 16 nm, an InGaAs spacer layer 4 maintaining a thickness of 4 nm, an InAlAs spacer layer 5 maintaining a thickness of 5 nm, an InAlAs doping layer 6 maintaining a thickness of 50 nm, and an InGaAs cap layer 7 maintaining a thickness of 5 nm by the MBE method or the like method. Here, donor impurities are added at a concentration of about $n = 1 \times 10^{18}$ cm$^{-3}$ to the InAlAs doping layer 6 and to the InGaAs cap layer 7 of the side of feeding carriers. Other than the InGaAs channel layer 3, furthermore, the In composition ratio is about 53% in the InGaAs layers 4 and 7, and is about 52% in the InAlAs layers 2, 5 and 6, so that the lattice constant becomes nearly equal to that of the InP substrate 1. The InGaAs channel layer 3, on the other hand, has an In composition ratio of 80% which is greater than that of other layers. As a result, the channel layer 3 exhibits an increased mobility but receives distortion as described earlier. Therefore, the thickness of the channel layer 3 is selected to be smaller than a critical film thickness with which a pseudomorphic state is obtained, and is determined by taking into consideration the critical film thickness (about 25 nm) when the In composition ratio is 80%.

The effects of the InGaAs spacer layer 4 in the above-mentioned substrate structure will now be theoretically described.

Figure 3:
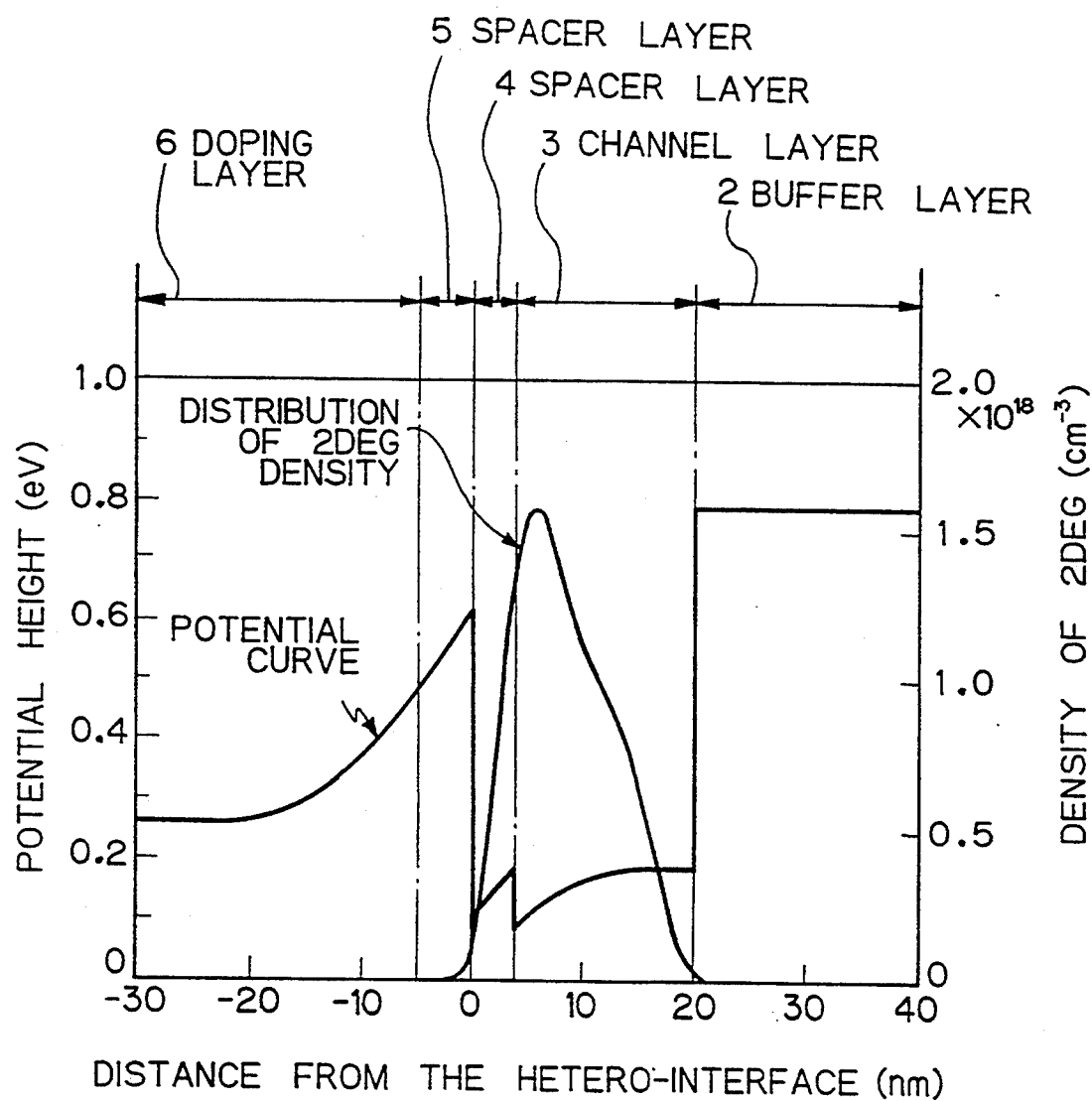
FIG. 3 is a diagram of the results of theoretical calculation to explain a potential profile and a distribution of the two-dimensional electron gas density of the HEMT (first embodiment) in which is inserted the InGaAs spacer layer having a thickness of 4 nm.
Figure 6:
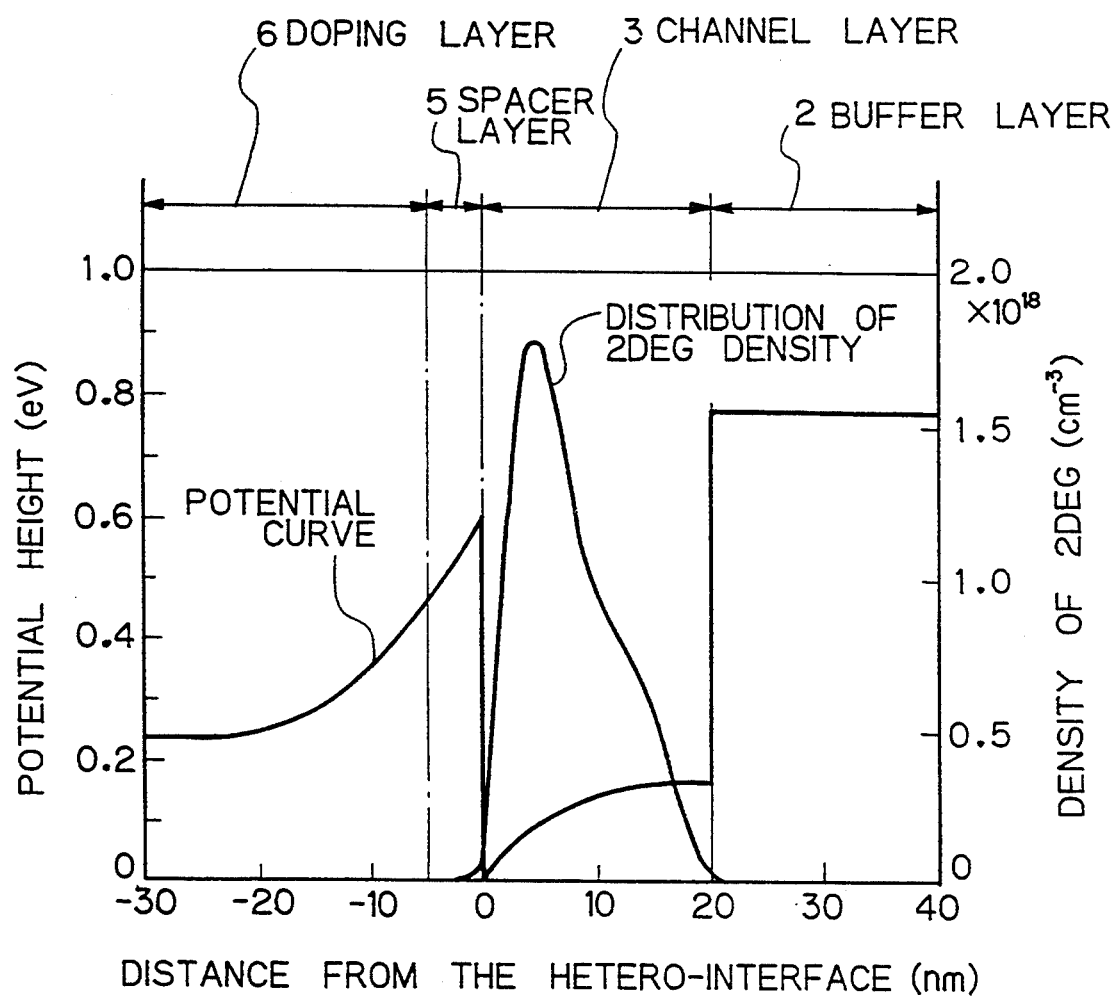
FIG. 6 is a diagram of the results of theoretical calculations to explain a potential profile and a distribution of the two-dimensional electron gas density of the pseudomorphic HEMT of a conventional structure.

FIG. 3 is a diagram of the results of calculations to explain a potential profile and a distribution of 2DEG of the HEMT which is inserted into the InGaAs spacer layer 4 having a thickness of 4 nm. Comparison with the results of calculation of the conventional structure of FIG. 6 indicates that the insertion of the InGaAs spacer layer 4 helps reduce the concentration 2DEG near the hetero-interface causing the distribution of electrons to be deviated toward a direction to separate away from the hetero-interface. Thus, the electrons are separated away from the donor impurities that exist in the doping layer 6, the scattering due to Coulomb force decreases, and the mobility of electrons running through the channel layer increases. Insertion of the InGaAs spacer 4 changes very little the amount of electrons that form the 2DEG, i.e., changes very little the concentration of carriers. It will, however, be learned that the electrons partly overflow into the InGaAs spacer layer 4. There still remains a problem in that the InGaAs spacer layer 4 has an In composition ratio which is smaller than that of the channel layer 3 and has a mobility which is slightly smaller than that of the channel layer 3. Therefore, if the InGaAs spacer layer 4 is too thick, electrons overflow in an increased amount into the InGaAs spacer layer 4 causing the mobility to be decreased.

Therefore, the InGaAs spacer layer 4 that helps improve performance of the HEMT element should have a film thickness within a suitable range as described below.

Figure 4:
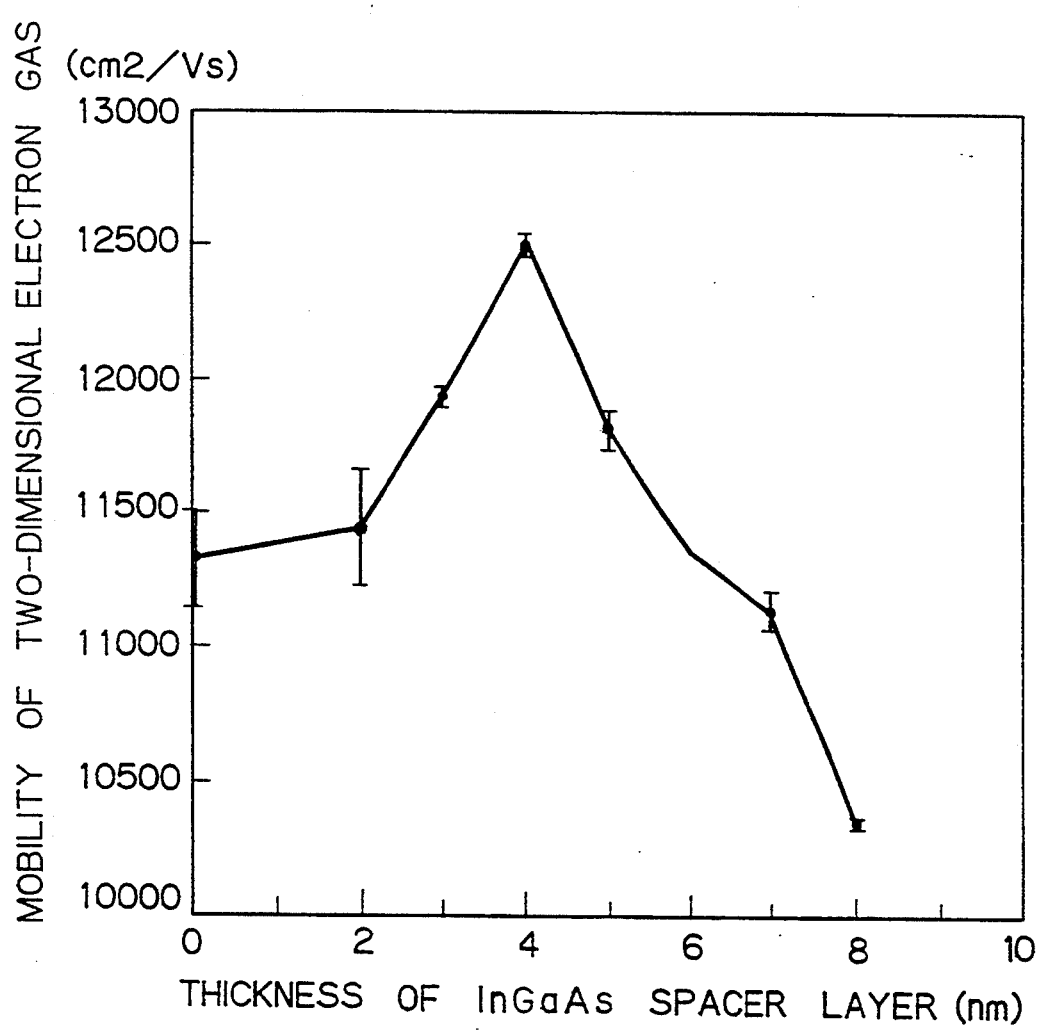
FIG. 4 is a diagram showing the measured values of mobility of the two-dimensional electron gas of when the thickness of the InGaAs spacer layer is changed in the first embodiment.

A sample of the structure shown in FIG. 2 is prepared having the InGaAs spacer layer 4 whose thickness varies over a range of from 0 to 8 nm, and the holes are measured to measure the mobility of 2DEG at room temperature (300K). Here, the sum of thicknesses of the InGaAs spacer layer 4 and the InGaAs channel layer 3 is selected to be a constant 20 nm. FIG. 4 shows a change of the mobility with respect to the thickness of the InGaAs spacer layer 4.

When the InGaAs spacer layer 4 has a thickness of 0 nm, i.e., in the case of the pseudomorphic HEMT of the conventional structure, as will be obvious from FIG. 4, the mobility is 11500 cm$^2$/Vs at the most while in the sample having the InGaAs spacer layer 4 which is 4 nm thick, the mobility is increased by about 9% to 12530 cm$^2$/Vs. Moreover, the mobility rather decreases when the thickness of the InGaAs spacer layer 4 is increased to be greater than 5 nm. This is attributed to the overflow of electrons into the InGaAs spacer layer 4. In the first embodiment of the present invention shown in FIG. 2, therefore, the thickness d of the InGaAs spacer layer 4 should be set to about 4 nm.

Compared to the pseudomorphic HEMT of the conventional structure, furthermore, the embodiment of the invention in which the InGaAs spacer layer 4 of 4 nm thick is inserted exhibits rather improved characteristics as shown in FIG. 4 even when the thickness of the InGaAs channel layer 3 to which distortion is imparted is decreased correspondingly or is selected to be, for example, 16 nm. Thus, the amount of distortion imparted to the film is decreased by an amount by which the thickness of the channel layer 3 that accompanies lattice distortion is decreased. Therefore, the effects due to aging and resistance anisotropy decrease, and reliability is improved. Furthermore, when the thickness of the channel layer 3 is set to be close to the critical thickness, the mobility greatly decreases around the critical film thickness and it can be presumed that the mobility greatly varies depending upon the elements. As described above, however, since the InGaAs channel layer 3 has a decreased thickness, the mobility changes little and elements having uniform characteristics are obtained. This is particularly effective at very low temperatures at which it is considered that the mobility increases and sharply changes in response to even a small change in the dislocation density that would not occur at room temperature. By decreasing the thickness of the InGaAs channel layer 3 as mentioned above, high-speed operation can be guaranteed over a wide range of temperatures.

In the embodiment of FIG. 2, the composition of the InGaAs spacer layer 4 was selected to be nearly the same as the composition of the InAlAs doping layer 6 so as to be lattice-matched with InP. However, the InGaAs spacer layer 4 is in no way limited to this composition but may have only an In composition ratio which is smaller than the In composition ratio of the InGaAs channel layer 3. In short, the InGaAs spacer layer 4 should have such an In composition ratio that exhibits a band gap that is greater than that of the InGaAs channel layer 3 but that is smaller than that of the InAlAs doping layer 6. Then, the InGaAs spacer layer 4 exhibits a band gap which is greater than that of the channel layer, and prevents the electrons from being concentrated near the hetero-interface. Moreover, the channel layer can be partly substituted by the InGaAs spacer layer which is less distorted than the channel layer to further improve reliability.

Though FIG. 2 illustrated the case of using the InP substrate, the same effects can be obtained even when the aforementioned InAlAs buffer layer, InGaAs channel layer, InGaAs spacer layer, InAlAs spacer layer, InAlAs doping layer and InGaAs cap layer are grown successively on a GaAs substrate via an InGaAs-graded buffer layer (structure in which the In composition of InGaAs gradually increases from 0 to a desired In composition such as 53% in a direction in which the crystal grows) in order to buffer the lattice mismatching.

Figure 5:
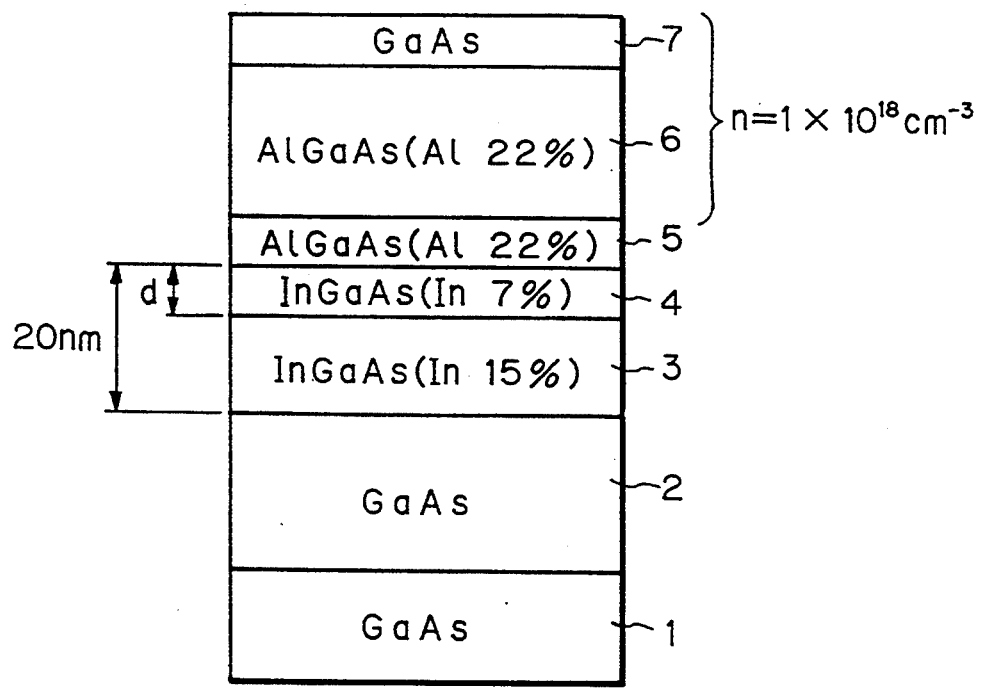
FIG. 5 is a diagram which schematically illustrates the structure of the substrate according to a second embodiment of the present invention.

Next, described below is a second embodiment of the present invention which is concerned with the HEMT structure of FIG. 1 but in which AlGaAs is used as a doping layer 6 to constitute an AlGaAs/InGaAs hetero-structure. FIG. 5 illustrates the substrate structure according to the second embodiment of the present invention wherein InGaAs is used as the channel layer 3 and AlGaAs is used as the doping layer 6. First, as shown in FIG. 5, on a semi-insulating GaAs substrate 1 are successively formed a GaAs buffer layer 2 maintaining a thickness of, for example, 200 nm, an InGaAs channel layer 3 and an InGaAs spacer layer 4 maintaining a total thickness of about 20 nm as in the aforementioned first embodiment, an AlGaAs spacer layer 5 maintaining a thickness of 5 nm, an AlGaAs doping layer 6 maintaining a thickness of 40 nm, and a GaAs cap layer 7 maintaining a thickness of 5 nm by the MBE method or the like method. Here, donor impurities have been added at a concentration of about $n=1$ to $2\times 10^{18}$ cm$^{-3}$. Further, the AlGaAs spacer layer 5 and the AlGaAs doping layer 6 have an Al composition ratio of 22%. The InGaAs channel layer 3 has an In composition ratio of, for example, 15% and the InGaAs spacer layer 4 has an In composition ratio of 7%.

Even in the constitution of this embodiment, the InGaAs spacer layer 4 has a band gap which is greater than that of the InGaAs channel layer 3 and exhibits distortion which is smaller than that of the InGaAs channel layer 3, making it possible to obtain the same effects as those of embodiment 1. Here, the optimum thickness of the InGaAs spacer layer 4 should be determined through the same experiment as the one illustrated in FIG. 4 and, should desirably be 3 to 5 nm.

We claim:

1. A compound semiconductor substrate which comprises:
    a first semiconductor region made of undoped InGaAs, said first semiconductor region including at least two semiconductor layers;
    a second semiconductor region made of a material, different from that of said first semiconductor region, and having a highest bottom energy band among any semiconductor layer in said first semiconductor region, and further said second semiconductor region including a layer having donor impurities added thereto; and
    wherein said first semiconductor region comprises a first undoped InGaAs layer as a main elemental layer and a second undoped InGaAs layer having an In content which is lower than that of said first undoped InGaAs layer, said second undoped InGaAs layer being proximate to said second semiconductor region.

2. A compound semiconductor substrate, according to claim 1, wherein said material forming said second semiconductor region is InAlAs.

3. A compound semiconductor substrate, according to claim 1, wherein said material forming said second semiconductor region is AlGaAs.

4. A compound semiconductor substrate, according to claim 1, wherein said In content of said second undoped InGaAs layer is set at a value with which a lattice thereof matches said second semiconductor region.

5. A compound semiconductor substrate according to claim 2, wherein said In content of said InAlAs of said second semiconductor region is substantially equal to that of said second undoped InGaAs layer.

6. A compound semiconductor substrate, according to claim 5, wherein a buffer layer comprising InAlAs is further provided on one surface of said first semiconductor region opposite to another surface thereon to which said second semiconductor region is connected, and said buffer layer having an In content which is substantially equal to a lattice constant of said second semiconductor region.

7. A compound semiconductor substrate according to claim 6, wherein said second semiconductor region further comprises an undoped InAlAs layer and an InAlAs layer having donor impurities added thereto, and serving as a main element of said second semiconductor region, and a portion of said second semiconductor region connected to said second undoped InGaAs layer is kept in an undoped condition.

* * * * *